(12) United States Patent
Coulon et al.

(10) Patent No.: US 9,503,119 B2
(45) Date of Patent: Nov. 22, 2016

(54) COMMON MODE SAMPLING MECHANISM FOR RESIDUE AMPLIFIER IN SWITCHED CURRENT PIPELINE ANALOG-TO-DIGITAL CONVERTERS

(71) Applicant: TEXAS INSTRUMENTS INCORPORATED, Dallas, TX (US)

(72) Inventors: Jesse Coulon, Richardson, TX (US); Manar El-Chammas, Dallas, TX (US); Xiaopeng Li, Plano, TX (US); Shigenobu Kimura, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/714,602

(22) Filed: May 18, 2015

(65) Prior Publication Data
US 2015/0349795 A1  Dec. 3, 2015

Related U.S. Application Data

(60) Provisional application No. 62/004,433, filed on May 29, 2014.

(51) Int. Cl.
| | |
|---|---|
| *H03M 1/12* | (2006.01) |
| *H03M 1/72* | (2006.01) |
| *H03F 3/45* | (2006.01) |
| *H03M 1/06* | (2006.01) |
| *H03M 1/16* | (2006.01) |
| *H03M 1/44* | (2006.01) |

(52) U.S. Cl.
CPC .......... *H03M 1/72* (2013.01); *H03F 3/45094* (2013.01); *H03F 3/45565* (2013.01); *H03M 1/0607* (2013.01); *H03F 2203/45396* (2013.01); *H03F 2203/45418* (2013.01); *H03F 2203/45424* (2013.01); *H03F 2203/45431* (2013.01); *H03M 1/164* (2013.01); *H03M 1/44* (2013.01)

(58) Field of Classification Search
CPC .. H03M 1/1245; H03M 1/72; H03M 1/0607; H03M 1/44; H03F 3/45094; H03F 3/45565; H03F 2203/45431; H03F 2203/45418
USPC .................................................. 341/155, 161
See application file for complete search history.

(56) References Cited

U.S. PATENT DOCUMENTS

| | | | | |
|---|---|---|---|---|
| 5,990,820 A | * | 11/1999 | Tan ....................... | H03M 1/168 341/156 |
| 7,663,516 B1 | * | 2/2010 | Chandra ............. | H03M 1/1038 341/120 |
| 8,040,264 B2 | * | 10/2011 | Hummerston ......... | H03M 1/12 327/94 |

(Continued)

*Primary Examiner* — Brian Young
(74) *Attorney, Agent, or Firm* — Gregory J. Albin; Frank D. Cimino

(57) ABSTRACT

A switched current pipeline analog-to-digital converter (ADC) integrated circuit. The integrated circuit comprises a track and hold circuit (T/H) and a residue amplifier. The T/H is configured to generate a differential output of the T/H based on an analog input. The residue amplifier is coupled to the T/H, configured to capture a sample of a common mode signal of the differential output of the T/H during a periodic pulse interval, wherein the pulse interval is less than half of the time duration of the period of the pulse, configured to generate a corrected input common mode feedback signal based in part on the sample of the common mode signal of the differential output of the T/H, and configured to generate a differential output of the residue amplifier based on the differential output of the T/H and based on the corrected input common mode feedback signal.

20 Claims, 3 Drawing Sheets

(56) References Cited

U.S. PATENT DOCUMENTS 8,368,430 B2 * 2/2013 Watanabe ............ G11C 27/026
          327/91

8,400,343 B1 * 3/2013 Lin ........................ H03M 1/14
          341/118

* cited by examiner

US 9,503,119 B2

COMMON MODE SAMPLING MECHANISM FOR RESIDUE AMPLIFIER IN SWITCHED CURRENT PIPELINE ANALOG-TO-DIGITAL CONVERTERS

CROSS-REFERENCE TO RELATED APPLICATIONS

The present application claims priority to U.S. Provisional Patent Application No. 62/004,433, filed May 29, 2014, titled "A Common Mode Sampling Mechanism For Residue Amplifier In Switched Current Pipeline ADCS," which is hereby incorporated herein by reference in its entirety.

BACKGROUND

Many electronic systems make use of analog-to-digital converter (ADC) circuits or chips. For example, ADCs may be used in wireless communication devices, video processing devices, set top box devices, mixed signal devices, system-on-a-chip (SOC) devices, application specific integrated circuit (ASIC) devices, a wide variety of control systems, and others. An ADC, generally, converts a time varying analog signal into a time ordered sequence of digital values, for example by sampling the analog signal periodically under control of a clock. Different implementations of ADCs may be designed and manufactured to achieve different engineering objectives. Design criteria may include speed, accuracy, cost, package footprint, power consumption, and the like. Some design criteria may be mutually antagonistic.

SUMMARY

In an embodiment, a switched current pipeline analog-to-digital converter (ADC) integrated circuit is disclosed. The integrated circuit comprises a track and hold circuit (T/H) and a residue amplifier. The T/H is configured to receive an analog input, to receive a reset clock signal, and to generate a differential output of the T/H based on the analog input and the T/H clock signal. The residue amplifier is coupled to the T/H and configured to receive the T/H clock signal, configured to receive the differential output of the T/H, configured to generate an input common mode signal from the differential output of the T/H, configured to generate a differential output of the residue amplifier, and configured to generate an output common mode signal based on the differential output of the residue amplifier. The residue amplifier is further configured to generate a common mode feedback signal based on a difference between the output common mode signal and a corrected input common mode signal, wherein the differential output of the residue amplifier is based on the differential output of the T/H and the common mode feedback signal, configured to generate a sample of the input common mode signal at a periodic rate of a reset clock signal and for a time duration that is less than half of a period of the reset clock signal, and configured to generate the corrected input common mode signal based on the sample of the input common mode signal.

In an embodiment, a method is disclosed. The method comprises generating, by a residue amplifier of a switched current pipeline analog-to-digital converter (ADC) integrated circuit, a differential output of the residue amplifier based on a reset clock signal, based on a differential output of a track and hold circuit (T/H), and based on a common mode feedback signal, generating, by the residue amplifier, a corrected input common mode signal by sampling an input common mode signal at a periodic rate of the reset clock signal and for a time duration that is less than half of a period of the reset clock signal, and generating, by the residue amplifier, the common mode feedback signal based on a difference between an output common mode signal and the corrected input common mode signal.

In an embodiment, a switched current pipeline analog-to-digital converter (ADC) integrated circuit is disclosed. The integrated circuit comprises a track and hold circuit (T/H) configured to generate a differential output of the T/H based on an analog input and a residue amplifier coupled to the T/H. The residue amplifier is configured to capture a sample of a common mode signal of the differential output of the T/H during a periodic pulse interval, wherein the pulse interval is less than half of the time duration of the period of the pulse, configured to generate a corrected input common mode feedback signal based in part on the sample of the common mode signal of the differential output of the T/H, and configured to generate a differential output of the residue amplifier based on the differential output of the T/H and based on the corrected input common mode feedback signal.

These and other features will be more clearly understood from the following detailed description taken in conjunction with the accompanying drawings and claims.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Residue amplifiers may be part of high speed switched current pipeline analog-to-digital converter (ADC) designs. Designs based on fully differential topologies may suffer from diminished settling time of the residue amplifier related to a common mode signal having a step component associated with a charge injection mechanism in a front-end track and hold component of the ADC. Prior design adaptations that aimed at solving this problem may have entailed one or more offsetting disadvantages such as higher power consumption and/or higher noise. The present disclosure teaches sampling an input common mode signal to generate a corrected common mode input signal. The input signal is sampled at a suitable time, e.g., when the input common mode signal is not modified by the charge injection mechanism. The present disclosure further teaches using this sampled input common mode signal (i.e., the corrected common mode input signal) in a common mode feedback loop.

Figure 1:
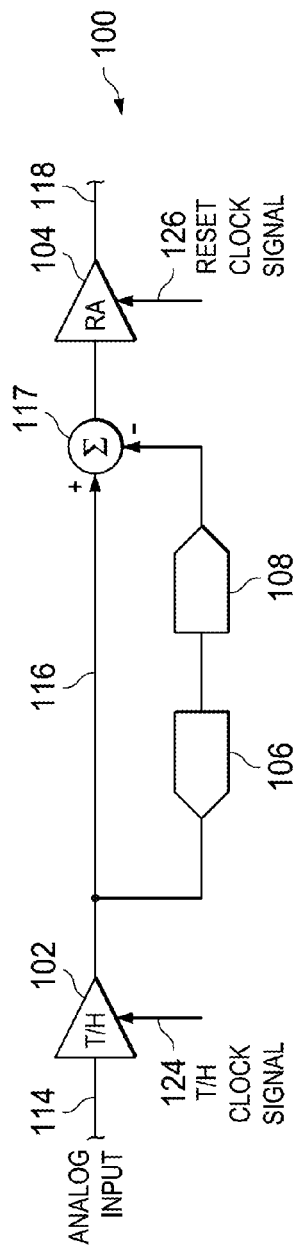
FIG. 1 shows a block diagram of a portion of switched current pipeline analog-to-digital converter in accordance with various examples.

FIG. 1 shows a block diagram of an exemplary switched current pipeline ADC circuit 100 or a stage of a switched current pipeline ADC. The ADC circuit 100 may be used in a variety of practical applications including but not limited to a mobile phone, a wireless communication device, a video player, a video processing device, a set top box device, a mixed signal device, a system on a chip (SOC) device, an application specific integrated circuit (ASIC) device, a wide variety of control systems and/or electronic control devices, and other applications.

The ADC circuit 100 comprises a track and hold component or circuit (T/H) 102, a residue amplifier 104, a summing component 117, an analog-to-digital converter 106 and a digital-to-analog converter 108. An analog input 114 and a T/H clock signal 124 feeds into the T/H 102. The output 116 is provided to the positive input of the summing component 117. The output 116 further is provided to the analog-to-digital converter 106 whose output is provided to the digital-to-analog converter 108. The output of the digital-to-analog converter 108 is provided to the negative input of the summing component 117. The output of the summing component 117 is provided to the residue amplifier 104. The output of the summing component 117 can be said to be the output of the T/H 102 minus the output of the digital-to-analog converter 108. A reset clock signal 126 is input to the residue amplifier 104. In an embodiment, the T/H clock signal 124 and the reset clock signal 126 are a common signal or are provided from a common source.

In an embodiment, the T/H clock signal 124 and the reset clock signal 126 have a fundamental frequency of at least 350 megahertz (MHz), although the frequency can be greater or less than 350 MHz. In some examples, the clock signals 124, 126 have a fundamental frequency of about 500 MHz. The fundamental frequency of clock signals may be determined based on the frequency of an edge of the clock signal, for example the frequency of a positive-going edge of the clock signal. Thus, a clock signal that has a fundamental frequency of about 350 MHz has a positive-going edge about 350,000,000 times per second. A clock signal that has a fundamental frequency of about 500 MHz has a positive-going edge about 500,000,000 times per second.

The output 118 of the residue amplifier 126 is the output of the switched current pipeline ADC circuit 100 or a stage of the switched current pipeline ADC. Besides those details shown in FIG. 1, other features may be present in the implementation of the ADC circuit 100. For example, the outputs of the T/H 102 may be differential, having a plus signal (Vip) and a minus signal (Vim), the outputs of the digital-to-analog converter 108 may be differential, the inputs to the summation component 117 and the outputs from the summation component 117 may be differential, and the inputs to the residue amplifier 104 from the summation component 117 may be differential, having a plus signal (DACp) and a minus signal (DACm). The output 118 of the residue amplifier 104 also may be a differential output having a plus signal (Vop) and a minus signal (Vom). In an embodiment, the ADC circuit 100 may comprise two summing components: a first summing component to generate the plus differential input to the residue amplifier 126 by summing the plus differential output of the T/H 102 with the negative value of the plus differential output of the digital-to-analog converter 108 and a second summing component to generate the minus differential input to the residue amplifier 126 by summing the minus differential output of the T/H 102 with the negative value of the minus differential output of the digital-to-analog converter 108.

In an embodiment, the differential output of the T/H 102 (i.e., Vip and Vim) has a non-zero common mode value. The common mode value of a differential signal is the average of the positive differential component and the negative differential component. In an ideal circuit, the common mode value would be zero; in practical, real circuits the common mode value of differential signals is often non-zero. That is, a differential signal pair often includes some amount of a common mode signal (i.e., a signal that is common to both differential signals). Additionally, this common mode signal, which may be referred to as the input common mode signal, is not stable but comprises a step component that is caused by a charge injection mechanism associated with the switching of the T/H 102 (i.e., switching between the track mode and the hold mode of operation). The disclosed embodiments advantageously provide a residue amplifier 104 that is configured to diminish the effect of the input common mode signal on the output of the residue amplifier 104. The general approach has been to employ a common mode feedback loop to correct for the input common mode signal, but at high sampling speeds (i.e., at high operating speeds) the stepping of the input common mode signal perturbs the common mode feedback circuit, as the feedback circuit attempts to correct for first the nominal input common mode and then the stepped input common mode level (the level associated with the charge injection mechanism). This extends the settling time of the residue amplifier 104, thereby reducing the attainable operating speed of a given ADC circuit 100. For example, in some embodiments of the ADC circuit 100 that lacks correction of the step component of the input common mode signal, a maximum operating speed of the ADC circuit 100 (without experiencing degraded analog-to-digital conversion performance) is about 250 MHz. It is thought that the circuit to produce a corrected input common mode signal taught by the present disclosure can significantly increase the operating speed of an ADC circuit 100 (by about two times in some embodiments) versus the operating speed of a similar realization of a switched current pipeline ADC that lacks the corrected input common mode circuit.

Figure 2:
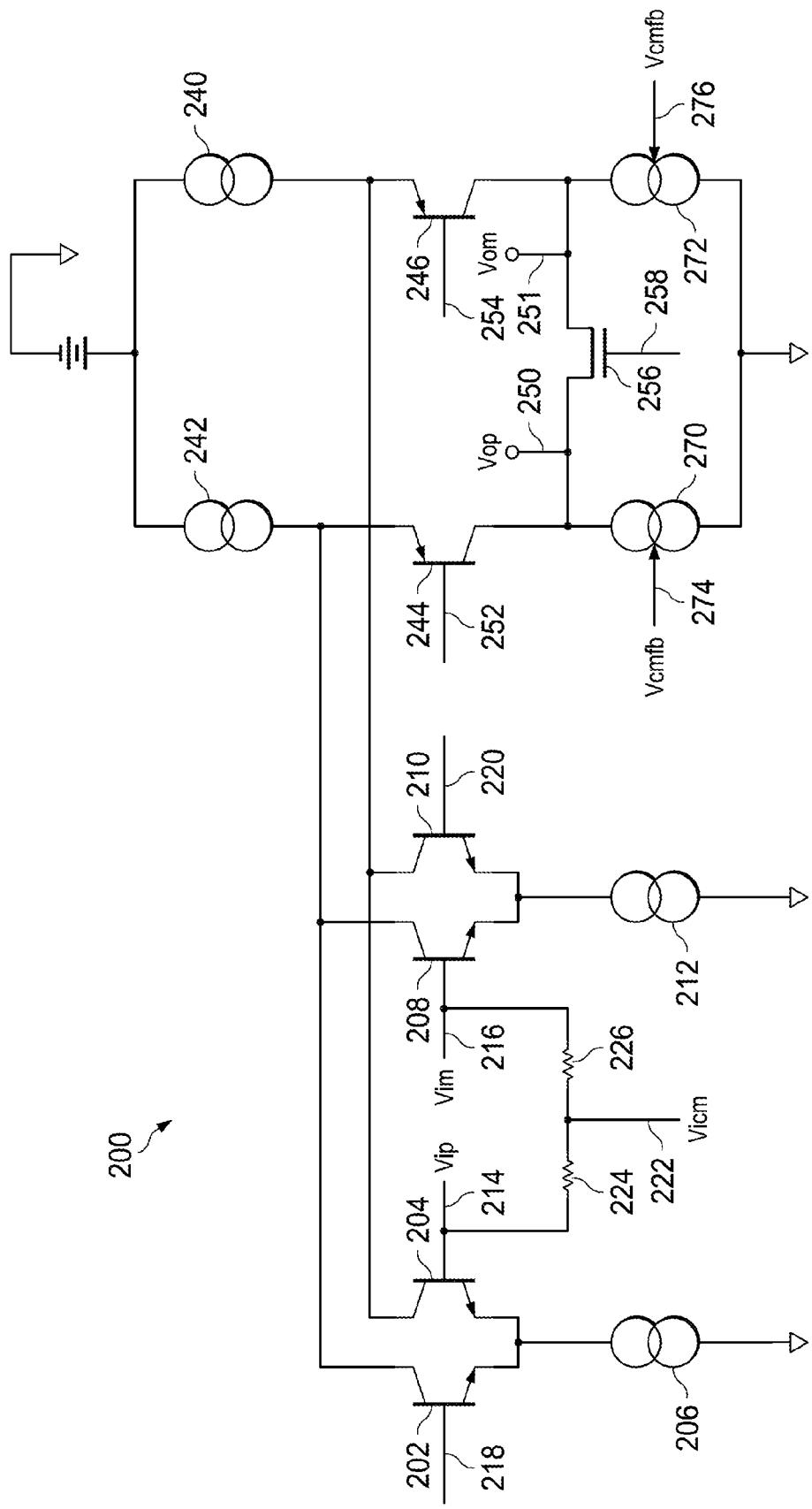
FIG. 2 shows a schematic diagram of a residue amplifier in accordance with various examples.

Turning now to FIG. 2, details of a residue amplifier 200 are described. It is understood that in some implementations, the residue amplifier 104 of FIG. 1 may be implemented in accordance with the design of the residue amplifier 200. The residue amplifier 200 comprises a first NPN transistor 202, a second NPN transistor 204, a third NPN transistor 208, and a fourth NPN transistor 210. A plus differential output of the T/H 102 (Vip) may be fed to a second input 214 coupled to the base of the second NPN transistor 204. A minus differential output of the T/H 102 (Vim) may be fed to a third input 216 coupled to the base of the third NPN transistor 208. A first current supply 206 may be coupled to the emitters of the first and second NPN transistors 202, 204. A second current supply 212 may be coupled to the emitters of the third and fourth NPN transistors 208, 210. A plus differential output of the DAC 108 may be fed to a first input 218 of the first NPN transistor 202. A minus differential output of the DAC 108 may be fed to a fourth input 220 of the fourth transistor 210.

A voltage divider formed by a first resistor 224 and a second resistor 226 may be coupled between the second input 214 and the third input 216. The output 222 of the voltage divider formed by resistors 224, 226 may develop, generate, create, or represent the input common mode signal (Vicm). This is the common mode signal of the T/H 102. As was said above with reference to FIG. 1, it is desirable to design the residue amplifier 200 to attenuate or eliminate the impact of this common mode signal (i.e., Vicm). The common mode signal, however, may comprise a step component associated with the charge injection mechanism related to switching in the T/H 102 and what may be referred to as a nominal component of the common mode signal (e.g., the common mode signal without the disturbance or perturbation of the common mode signal by the charge injection mechanism). In an embodiment, this common mode signal with the step component may have a voltage value that could be graphically represented by a pulse waveform, where the raised portion of the pulse waveform is associated with the voltage step introduced by the charge injection mechanism (the difference between the raised portion and a low portion of the waveform represents the charge injection mechanism disturbance: in some instances this difference may be as large as 100 mV or more) and where the low portion (not zero voltage) of the pulse waveform is associated with the nominal component of the common mode signal. The fundamental frequency of the pulse waveform of the common mode signal is substantially the same as the fundamental frequency of the reset clock signal 124. If this input common mode signal is used directly in the common mode feedback loop, as known in the prior art, the settling time of the residue amplifier 200 is adversely affected, as the feedback loop may be said to "chase" the ever stepping common mode signal.

The residue amplifier 200 further comprises a third current source 242, a fourth current source 240, a fifth current source 270, and a sixth current source 272. The residue amplifier 200 further comprises a first PNP transistor 244 and a second PNP transistor 246. The output of the third current source 242 is coupled to the collector of the first NPN transistor 202, to the collector of the third NPN transistor 208, and to the emitter of the first PNP transistor 244. The output of the fourth current source 240 is coupled to the collector of the second NPN transistor 204, the collector of the fourth NPN transistor 210, and to the emitter of the second PNP transistor 246. The base 252 of the first PNP transistor 244 is coupled to a bias voltage and the base 254 of the second PNP transistor 246 is coupled to a bias voltage.

The output of the residue amplifier 200 is a differential output having a plus output (Vop) 250 and a minus output (Vom) 251. The outputs 250, 251 associate to the output 118 of the residue amplifier 104 referenced in FIG. 1. The residue amplifier 200 further comprises a switch 256 controlled by a reset clock input 258. The reset clock input 258 corresponds to second reset clock signal 126 to the residue amplifier 104 referenced in FIG. 1. When the switch is closed, the differential outputs 250, 251 are shorted to each other and hence have a zero differential signal value. When the switch is open, the differential outputs 250, 251 are enabled. The fifth current source 270 is modulated by a first common mode feedback (Vcmfb) signal 274, and the sixth current source 272 is modulated by a second common mode feedback (Vcmfb) signal 276. The first and second common mode feedback signal 274, 276 are supplied from the same source. It is understood that some details of the residue amplifier 200 may not be depicted in FIG. 2. Additionally, in some embodiments, the residue amplifier 200 may be implemented in slightly different forms, for example with different transistors.

Figure 3:
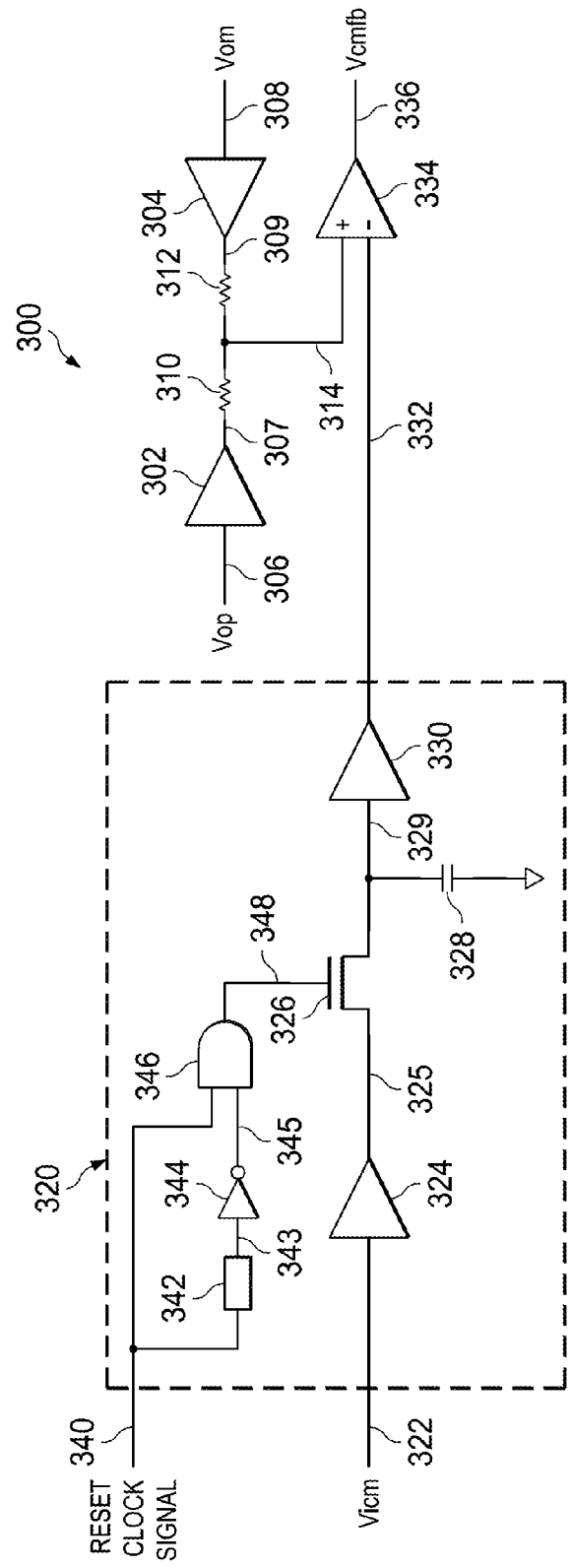
FIG. 3 shows a block diagram of a common mode feedback circuit in accordance with various examples.

Turning now to FIG. 3, a common mode feedback circuit 300 is described. The common mode feedback circuit 300 is part of the residue amplifier 200. A common mode feedback signal 336 that is provided to the first and second common mode feedback signals 274, 276 is generated as a single ended output of an amplifier 334. The amplifier 334 determines a difference between an output common mode signal 314 and a corrected input common mode signal 332. The residue amplifier 200 plus output 250 (Vop) couples to a first buffer input 306 to a first buffer amplifier 302, and the residue amplifier 200 minus output 252 (Vom) couples to a second buffer input 308 to a second buffer amplifier 304. A buffer amplifier is an amplifier with a gain of one (unity gain). The buffer amplifier topology may be implemented in various forms. The buffer amplifier unloads (i.e., draws negligible current from) the input circuit that feeds the buffer amplifier. The first buffer amplifier 302 has a first buffer output 307, and the second buffer amplifier 304 has a second buffer output 309. The outputs 307, 309 of the buffer amplifiers 302, 304 are provided to a voltage divider formed by a third resistor 310 and a fourth resister 312 to generate the output common mode signal 314.

The common mode feedback circuit 300 further comprises an input common mode correction sub-circuit 320. The sub-circuit 320 may also be referred to as a sample-and-hold circuit in some contexts. The input common mode correction sub-circuit 320 comprises a delay element 342, an inverter 344, and an AND gate 346. A clock input 340 that is fed by the reset clock signal is coupled to an input of the delay element 342 and to a first input of the AND gate 346. The output of the delay element 343 is coupled to the input of the inverter 344. The output of the inverter 345 is coupled to a second input of the AND gate 346. The delay element 342, the inverter 344, and the AND gate develop a pulse control signal 348 that has a period equal to the period of the reset clock signal and a time duration that is less than half of the period of the reset clock signal. In some contexts, the components 342, 344, 346 may be referred to as a pulse generator circuit.

Figure 4:
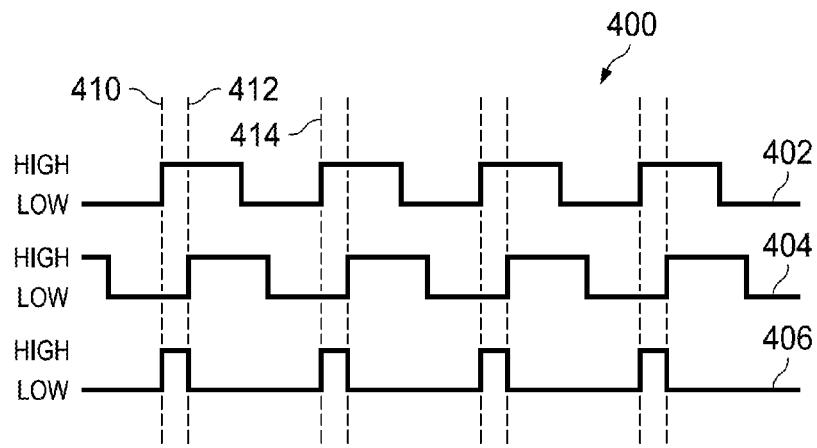
FIG. 4 shows a plurality of waveforms related to a sampling pulse in accordance with various examples.

Turning to FIG. 4, a waveform diagram 400 is described. The reset clock wave 402 represents the reset clock signal that is input to the clock input 340. The delayed reset clock wave 404 represents the output of the delay element 342: a delayed version of the reset clock signal. The pulse wave 406 represents the output of the AND gate 346. The output 348 of the AND gate 346 is a logic high when the clock input 340 (reset clock wave 402) is a logic high and at the same time the output of the delay element 342 (delayed reset clock wave 404) is a logic lo. Thus, the output of the AND gate 346 transitions to logic high at time line 410 and transitions logic low at time line 412. The period of the pulse wave 406 is defined by the time interval extending from time line 410 to time line 414. The periodic frequency of the pulse wave 406 can be determined as proportional to the inverse of the period. It can be seen in FIG. 4 that the periodic frequency of the pulse wave 406 and of the reset clock wave 402 are the same and that the time duration of the high logic level of the pulse wave 406 is less than half of the period of the reset clock signal. It may be said that the fundamental frequency of the reset clock wave 402 and the fundamental frequency of the pulse wave 406 are substantially equal. It will be appreciated that the pulse generator circuit can be adopted as needed to generate the desired pulse positioned relative to the reset clock wave 402. For example, the delay can be increased or decreased by selecting the delay element 342 or by cascading multiple delay elements. The output of the delay chain (e.g., one or more delay elements 342) may be fed directly to the AND gate 346, omitting the inverter 344. An inverter may be coupled between the input 340 and the input of the AND gate 346.

Turning again to FIG. 3, the input common mode correction sub-circuit 320 further comprises a third buffer amplifier 324, a fourth buffer amplifier 330, a switch 326, and a capacitor 328 that implement a sample and hold function. The switch 326 may be referred to as an electronic switch. The switch 326 may be implemented as a field effect transistor or as some other electronic component in the ADC integrated circuit. When the pulse of the pulse generator circuit is active (logic high), the switch 326 may be closed (i.e., promotes current flow through the switch 326) and when the pulse generator circuit is inactive (logic low), the switch 326 is open (i.e., blocks current flow through the switch 326). When the switch 326 is closed, the capacitor 328 is charged by the output 325 of the third buffer amplifier 324, thereby tracking the input 322 to the third buffer amplifier 324; when the switch 326 is open, the capacitor 328 is decoupled from the output 325 of the third buffer amplifier 324 and hence holds the value of the input 322 of the third buffer amplifier 324. The input 329 of the fourth buffer amplifier 330 is coupled to the capacitor 329 and thus generates the corrected input common mode signal 332 as the value stored by the capacitor 329 without loading the capacitor 329. The output 222 (Vicm) is coupled to the input 322, and hence the input common mode correction sub-circuit 320 samples and holds the value of the output 222—the input common mode signal (uncorrected).

It is observed that the portion of the input common mode signal that is tracked and provided as the output of the fourth buffer amplifier 330 (the corrected input common mode signal 332) is selected by the pulse output by the AND gate 346 (the pulse wave 406 illustrated in FIG. 4) via the switch 326. This pulse is aligned to select that portion of the output 222 (Vicm: input common mode signal) that is not perturbed by the disturbance associated with the charge injection mechanism. In some contexts, selecting or holding the output 222 may be referred to as sampling the input common mode signal and/or the common mode signal of the T/H 102. Therefore, the output of the input common mode correction sub-circuit 320 may be referred to as the corrected input common mode signal: the input common mode signal has been corrected by excluding the disturbance step associated with the charge injection mechanism in the T/H 102. The selected portion of the input common mode signal that excludes the disturbance step associated with the charge injection mechanism may be referred to as the nominal input common mode signal.

Figure 5:
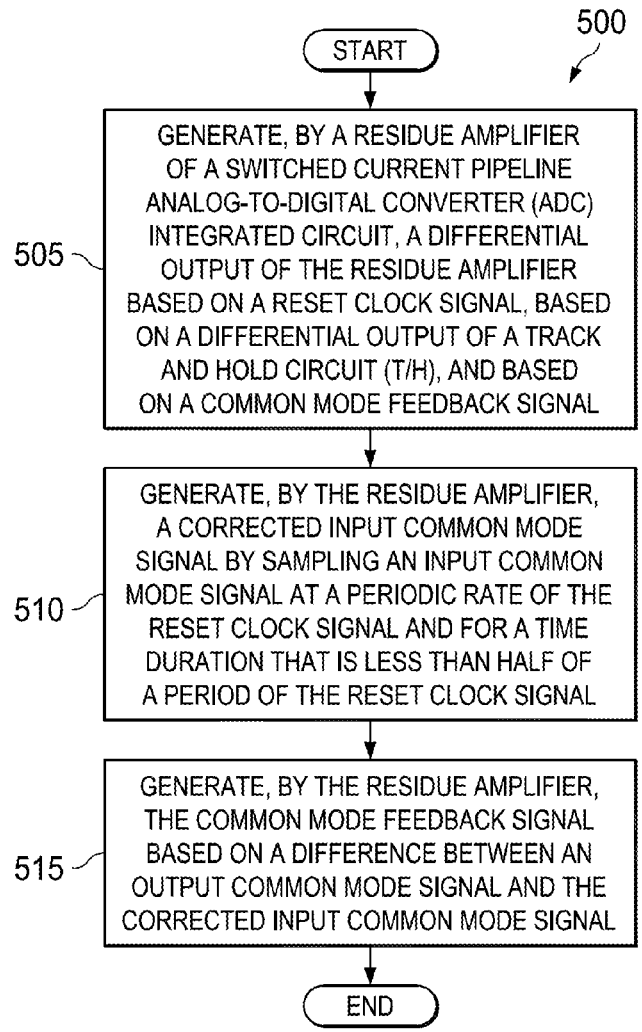
FIG. 5 is a flow chart of a method according to an embodiment of the disclosure.

Turning now to FIG. 5, a method 500 is described. At block 505, a residue amplifier of a switched current pipeline analog-to-digital converter (ADC) integrated circuit generates a differential output of the residue amplifier based on a reset clock signal, based on a differential output of a track and hold circuit (T/H), and based on a common mode feedback signal. At block 510, the residue amplifier generates a corrected input common mode signal by sampling an input common mode signal at a periodic rate of the reset clock signal and for a time duration that is less than half of a period of the reset clock signal. At block 510, the residue amplifier generates the common mode feedback signal based on a difference between an output common mode signal and the corrected input common mode signal. It is understood that the method 500 may comprise additional steps. The method 500 may further comprise the T/H receiving an analog input. The method 500 may further comprise the T/H receiving the T/H clock signal. The method 500 may further comprise the T/H generating the differential output of the T/H based on the analog input and the reset clock signal. The method 500 may further comprise the residue amplifier generating the input common mode signal from the differential output of the T/H. Additionally, it is understood that the sequence of steps of the method 500 may be repeated many times, for example at a rate that corresponds to the rate of the reset clock signal.

It will be appreciated that the circuits described above may, in some embodiments, be varied in a number of different elements. Additionally, not all details of circuits are depicted or described, to make the drawings more easily understood and the textual explanations more concise.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A switched current pipeline analog-to-digital converter (ADC) integrated circuit, comprising:
    a track and hold circuit (T/H) configured to receive an analog input, to receive a T/H clock signal, and to generate a differential output of the T/H based on the analog input and the T/H clock signal; and
    a residue amplifier coupled to the T/H and configured to receive a reset clock signal, configured to receive the differential output of the T/H, configured to generate an input common mode signal from the differential output of the T/H, configured to generate a differential output of the residue amplifier, configured to generate an output common mode signal based on the differential output of the residue amplifier, configured to generate a common mode feedback signal based on a difference between the output common mode signal and a corrected input common mode signal, wherein the differential output of the residue amplifier is based on the differential output of the T/H and the common mode feedback signal, configured to generate a sample of the input common mode signal at a periodic rate of the reset clock signal and for a time duration that is less than half of a period of the reset clock signal, and configured to generate the corrected input common mode signal based on the sample of the input common mode signal.

2. The integrated circuit of claim 1, wherein the residue amplifier is configured to operate when receiving a reset clock signal having a fundamental frequency of at least 350 megahertz (MHz).

3. The integrated circuit of claim 1, wherein the residue amplifier comprises a sample and hold circuit that is configured to generate the sample of the input common mode signal.

4. The integrated circuit of claim 3, wherein the sample and hold circuit comprises a pulse generator circuit that is configured to generate a pulse at the periodic rate of the reset clock signal, wherein the pulse has a time duration of less than half the period of the reset clock signal.

5. The integrated circuit of claim 4, wherein the sample and hold circuit comprises:
a first buffer amplifier that that is configured to receive the input common mode signal,
an electronic switch having an input coupled to an output of the first buffer amplifier and having a control input coupled to an output of the pulse generator circuit,
a capacitor coupled to an output of the electronic switch, and
a second buffer amplifier having an input coupled to the output of the electronic switch and to the capacitor,
wherein the sample and hold circuit is configured to track the input common mode signal when the pulse generated by the pulse generator circuit is active and to hold a previous value of the input common mode signal when the pulse generated by the pulse generator circuit is inactive, and
wherein the sample and hold circuit is configured to generate the corrected input common mode signal as an output of the second buffer amplifier.

6. The integrated circuit of claim 4, wherein the pulse generator circuit comprises:
a delay component configured to receive the reset clock signal and to output a delayed reset clock signal,
an inverter configured to receive the delayed reset clock signal and to output an inverted delayed reset clock signal, and
an AND gate configured to receive the reset clock signal at a first input of the AND gate, configured to receive the inverted delayed reset clock signal at a second input of the AND gate, and to generate the pulse based on the reset clock signal and based on the inverted delayed reset clock signal.

7. The integrated circuit of claim 1, wherein the integrated circuit is used in one of a mobile communication device, a video player, a set top box, an application specific integrated circuit (ASIC), or a mixed signal device.

8. A method, comprising:
generating, by a residue amplifier of a switched current pipeline analog-to-digital converter (ADC) integrated circuit, a differential output of the residue amplifier based on a reset clock signal, based on a differential output of a track and hold circuit (T/H), and based on a common mode feedback signal;
generating, by the residue amplifier, a corrected input common mode signal by sampling an input common mode signal at a periodic rate of the reset clock signal and for a time duration that is less than half of a period of the reset clock signal; and
generating, by the residue amplifier, the common mode feedback signal based on a difference between an output common mode signal and the corrected input common mode signal.

9. The method of claim 8, further comprising:
receiving, by the T/H, an analog input;
receiving, by the T/H, the reset clock signal;
generating, by the T/H, the differential output of the T/H based on the analog input and the reset clock signal.

10. The method of claim 9, further comprising generating, by the residue amplifier, the input common mode signal from the differential output of the T/H.

11. The method of claim 10, wherein the input common mode signal has a step component associated with a charge injection mechanism in the T/H.

12. The method of claim 11, wherein the input common mode signal is sampled during a time duration when the step component is absent from the input common mode signal.

13. The method of claim 12, further comprising generating a pulse based on the reset clock signal, wherein the pulse has a fundamental frequency that is the same as the fundamental frequency of the reset clock signal, wherein the pulse is active when the step component is absent from the input common mode signal, and wherein the pulse controls the sampling of the input common mode signal.

14. The method of claim 8, wherein the reset clock signal has a fundamental frequency of at least 350 megahertz (MHz).

15. A switched current pipeline analog-to-digital converter (ADC) integrated circuit, comprising:
a track and hold circuit (T/H) configured to generate a differential output of the T/H based on an analog input; and
a residue amplifier coupled to the T/H, configured to capture a sample of a common mode signal of the differential output of the T/H during a periodic pulse interval, wherein the pulse interval is less than half of the time duration of the period of the pulse, configured to generate a corrected input common mode feedback signal based in part on the sample of the common mode signal of the differential output of the T/H, and configured to generate a differential output of the residue amplifier based on the differential output of the T/H and based on the corrected input common mode feedback signal.

16. The integrated circuit of claim 15, wherein the residue amplifier comprises a sample and hold circuit configured to sample the common mode signal of the differential output of the T/H when a step component is absent from the common mode signal of the differential output of the T/H and configured to output the corrected input common mode feedback signal.

17. The integrated circuit of claim 16, wherein the sample and hold circuit comprises a pulse generator that controls the sampling of the common mode signal of the differential output of the residue amplifier.

18. The integrated circuit of claim 17, wherein the pulse generator is configured to generate a pulse based on the reset clock signal and based on an inverted delayed reset clock signal.

19. The integrated circuit of claim 18, wherein the pulse generator is configured to generate the inverted delayed reset clock signal based on the reset clock signal.

20. The integrated circuit of claim 15, wherein the reset clock signal has a fundamental frequency of at least 350 megahertz (MHz).

* * * * *